United States Patent [19]

Ogawa et al.

[11] Patent Number: 5,050,474

[45] Date of Patent: Sep. 24, 1991

[54] ANALOG SIGNAL SYNTHESIZER IN PCM

[75] Inventors: Toru Ogawa; Seijchi Sato, both of Tokyo, Japan

[73] Assignee: Namco Ltd., Tokyo, Japan

[21] Appl. No.: 335,383

[22] Filed: Apr. 10, 1989

[30] Foreign Application Priority Data

Apr. 13, 1988 [JP] Japan .................................. 63-90575

[51] Int. Cl.[5] ........................ G10H 7/12; H03M 1/08; H04L 27/06

[52] U.S. Cl. ........................................ 84/603; 84/604; 84/DIG. 9; 341/122; 375/96; 375/103

[58] Field of Search ........... 84/603, 621, 624, DIG. 9, 84/633, 604, 605, 606, 607; 364/178, 723; 360/32; 375/96, 103; 341/122, 123, 124, 125; 332/107, 109, 112; 381/51, 36-40

[56] References Cited

U.S. PATENT DOCUMENTS 4,030,129 6/1977 Whitlock .............................. 360/32
4,460,890 7/1984 Busby .................................... 341/61
4,600,915 7/1986 Yoshida ............................. 341/122
4,602,545 7/1986 Starkey ............................... 84/607
4,621,254 11/1986 Belcher ............................. 341/122
4,660,162 4/1987 Berlinsky ........................... 364/723
4,673,916 6/1987 Kitamura et al. .................. 364/178
4,701,956 10/1987 Katoh ................................. 364/723
4,715,257 12/1987 Hoshiai et al. ....................... 84/604

FOREIGN PATENT DOCUMENTS 218912 4/1987 European Pat. Off. .............. 84/603
157072 12/1979 Japan .................................. 341/122
120127 6/1987 Japan .................................. 341/123

OTHER PUBLICATIONS

"Interface", Nov., 1987, No. 126, Japan.

*Primary Examiner*—Geoffrey S. Evans
*Attorney, Agent, or Firm*—Oliff & Berridge

[57] ABSTRACT

An analog signal synthesizing apparatus includes a waveform memory for storing a plurality of analog signals as PCM data sampled with different sampling frequencies, the amount of PCM data corresponding to plural channels being read from the waveform memory and used to synthesize the analog signals. The analog signal synthesizing apparatus includes an oversampling device for shifting the sampling frequency of the PCM data read from the waveform memory for each channel toward the side of high frequency; a summing device for summing the oversampled PCM data for the respective channel; a D/A converter for converting the summed data into an analog signal; and a low-pass filter for setting a cut-off frequency based on the sampling frequency shifted to the side of high frequency and for eliminating aliasing noises included in the PCM data from the synthesized analog signal. The elimination of the aliasing noises included in the PCM data for each channel is carried out at the common low-pass filter.

21 Claims, 10 Drawing Sheets

| FIG. 1A | FIG. 1B |
|---|---|

CHØ
CH1
CH23
WORK
INTERRUPT
Ø
1ØH
2ØH
17ØH
18ØH
1F8H
(3F8H ON EXTENSION)

INDICATION OF PSG
L VOLUME
R(FM) VOLUME
FREQUENCY
BANK
FLAG
START
ADDRESS
END
ADDRESS
REPEAT
ADDRESS
UPPER
BUFFER
LOWER
BUFFER
Ø 2 4 6 8 A C E
INDICATION OF NOISE
L VOLUME
R(FM) VOLUME
FREQUENCY
NOISE BUFFER
FLAG
NOISE
BUFFER
LOWER
BUFFER
Ø 2 4 6 8 A C E

INTERVAL
INT1 CLEAR
INTØ SET
INTØ CLEAR
1F8 A C E fs: SAMPLING FREQUENCY fc: ORIGINAL SIGNAL CUTTING-OFF FREQUENCY

ANALOG SIGNAL SYNTHESIZER IN PCM

BACKGROUND OF THE INVENTION

1. Field of the Invention

The present invention relates to an analog signal synthesizing system in PCM and more particularly to such a system capable of reading PCM data corresponding to plural channels from a waveform memory and synthesizing an analog signal from such PCM data.

2. Description of the Prior Art

PCM has various superior characteristics such as very high resistance to noise, very high resistance to interference with the adjacent channel and others. Therefore, PCM has been currently utilized in various broadly widened applications such as synthesizers, musical compact disc devices, PCM communication systems and others.

FIG. 8 shows the principle of PCM wherein it is supposed that an analog signal such as voice is converted into PCM signal. As shown in FIG. 8A, an analog signal is sampled with a predetermined sampling frequency to form a PAM wave as shown in FIG. 8B. Such a PAM wave is quantized and encoded to provide PCM data.

If the PCM data so obtained are desired to re-convert into an analog signal, they are first decoded to form the PAM wave as shown in FIG. 8B. The PAM wave is then passed through a low-pass filter to reproduce a signal wave having the original signal waveform.

When the analog signal is sampled with the frequency $f_s$, there is obtained such a waveform spectra as shown in FIG. 9. In FIG. 9, the hatched part is a spectra in the original analog signal. If such a sampling is carried out, there are created a plurality of aliasing noises at locations integer times the sampling frequency, that is, $f_s$, $2f_s$, $3f_s$ and so on. These aliasing noises will be superposed over the waveform spectra in the present signal if the sampling frequency $f_s$ is too low. Thus, it becomes impossible to faithfully reproduce the original analog signal.

If the sampling frequency $f_s$ is too high, however, the amount of data to be handled increases to make the data processing very cumbersome.

In order to faithfully reproduce the original analog signal while minimizing the amount of data to be handled, thus, it is necessary to set the sampling frequency as low as possible within a range over which the aliasing noises are not mixed with the original signal.

In accordance with the sampling theorem, the sampling frequency may be set at a level two times or more the maximum frequency in the original analog signal to prevent the waveform spectra thereof from being mixed with the aliasing noises. If the sampling frequency is set at a level two times the maximum frequency of an objective analog signal, the amount of data to be handled can be minimized so that the original analog signal can be faithfully reproduced.

FIG. 10 illustrates an example of the conventional analog signal synthesizing systems utilizing such PCM technique.

Such a system comprises a waveform memory 10 adapted to store a plurality of analog signals as PCM data which have been sampled with different sampling frequencies. PCM data corresponding to three channels are read out from the waveform memory 10 to synthesize an analog signal.

For example, if the analog signal synthesizing system is to be used to produce a synthesized sound combining a plurality of musical instruments, voice analog signals from the objective musical instruments, for example, guitar, drums and bass are previously stored in the waveform memory 10 as PCM data which are sampled with frequencies $f_{s1}$, $f_{s2}$ and $f_{s3}$ corresponding to those of the musical instrument.

PCM data having the respective sampling frequencies $f_{s1}$, $f_{s2}$ and $f_{s3}$ are read from the waveform memory 10 through the first, second and third channels and converted into analog signals through D/A converters 12-1, 12-2 and 12-3. These analog signals are then inputted into low-pass filters 14-1, 14-2 and 14-3, respectively. Aliasing noises are removed from the inputted analog signals by the respective low-pass filters 14-1, 14-2 and 14-3. Thereafter, the analog signals are applied to a mixer 18 through amplifiers 16-1, 16-2 and 16-3, respectively. At the mixer 18, the analog signals inputted thereinto and corresponding to three channels are mixed to form a synthesized analog from the three analog signals, for example, a synthesized analog sound waveform consisting of the sound waves representative of the guitar, drums and bass.

In order to use the low-pass filter 14 to remove the aliasing noises included in the PCM data, it is necessary to set the cut-off frequencies $f_c$ in each of the low-pass filters 14-1, 14-2 and 14-3 at a level one-half the sampling frequency $f_s$ as shown in FIG. 11A. This is because if the cut-off frequency $f_c$ is higher than $\frac{1}{2} f_s$ as shown in FIG. 11B, a part of the aliasing noises remains in the PCM data and will be reproduced as noises.

As described hereinbefore, however, the PCM data read from the waveform memory through the first, second and third channels are different from one another in the sampling frequencies $f_{s1}$, $f_{s2}$ and $f_{s3}$. There is thus a problem in that the low-pass filters 14-1, 14-2 and 14-3 corresponding to the respective channels must be set at different cut-off frequencies $f_{c1}$, $f_{c2}$ and $f_{c3}$.

In particular, such a conventional system is designed such that the sampling frequency of the PCM data read out from the waveform memory 10 is in one-to-one relationship with the cut-off frequency $f_c$ in the low-pass filter 14. Therefore, each of the channels is poor in universality. This takes place a problem in that the particular PCM data can be read out only from the corresponding channel, for example, the sound of a guitar from the first channel, the sound of drums from the second channel and the sound of a bass from the third channel.

When it is wanted to read many different PCM data, for example, ten or twenty different PCM data from the waveform memory 10, the number of channels corresponding to the number of the different PCM data portions must be provided. This results in a further problem in that the entire construction of the system becomes costly and more complicated.

SUMMARY OF THE INVENTION

In view of the above problems of the prior art, it is an object of the present invention to provide an analog signal synthesizing system in PCM wherein the aliasing noises included in the PCM data for the respective channels can be removed through a common low-pass filter.

To this end, the present invention provides an analog signal synthesizing system in PCM, comprising a waveform memory for storing a plurality of analog signals as PCM data which are respectively sampled with different sampling frequencies, the PCM data corresponding to plural channels being read out from said waveform memory and used to synthesize an analog signal, the improvement being characterized in that said system comprises:

oversampling means for shifting the sampling frequency of the PCM data corresponding to each of the channels which is read out from the waveform memory toward the side of high frequency;

adding means for summing the oversampled PCM data for each channel;

D/A converting means for converting the summed data into an analog signal; and a common low-pass filter having a cut-off frequency set based on the sampling frequency shifted toward the high frequency side, said common low-pass filter being adapted to remove aliasing noises included in the PCM data from said synthesized analog signal.

In such an arrangement, the waveform memory stores a plurality of analog signals as PCM data which are sampled with different sampling frequencies.

When the PCM data corresponding to each of the channels are read out from the waveform memory, they are then oversampled. Such an oversampling process may be a process for determining new data utilizing, for example, various interpolations such as primary interpolation, secondary interpolation and so on. There is also a process of using the same data as those of the waveform memory for each oversampled point and digital filtering them as original data to determine new data. Such digital filtering processes include a filtering in the frequency region due to the discrete Fourier transformation (digital low-pass filter) or another filtering in time region fold in the impulse response of the filter (smoothing). The digital filter is more fully described in "Interface", November 1987, No. 126.

On such an oversampling, the read-out PCM data corresponding to each of the channels will have its sampling frequency which is shifted toward the side of high frequency.

It is now assumed that PCM data are read out from the waveform memory through each of the channels as shown in FIG. 2A. When the PCM data so read out are oversampled as described, the sampling frequency $f_{s1}$, $f_{s2}$ or $f_{s3}$ corresponding to each of the channels will be shifted toward a higher frequency $f_{DA1}$, $f_{DA2}$ or $f_{DA3}$. In such a manner, the present invention shifts any aliasing noise having its lower frequency included in the PCM data toward the region of higher frequency so that the spectra in the original signal as shown by hatching in FIG. 2A are more broardly spaced away from the spectra of the adjacent aliasing noise.

The oversampled PCM data for each channel are summed by adding means and converted into an analog signal through D/A converting means. Thereafter, the analog signal is applied to the low-pass filter. As described hereinbefore, the low-pass filter has its cut-off frequency set based on the sampling frequency shifted toward the higher frequency by the oversampling process, thereby removing any aliasing noise included in the PCM data from the input synthesized analog signal.

In accordance with the present invention, thus, the PCM data corresponding to each of the channels are oversampled to forcedly shift the aliasing noises having their lower frequencies toward the region of higher frequency. Therefore, the PCM data for each channel will have a widened spacing of frequency between the maximum frequency of the original signal and the minimum frequency of the aliasing noises. It is thus possible to set the same cut-off frequency of the low-pass filter for the PCM data corresponding to all the channels.

In accordance with the present invention, further, the PCM data for the respective channels are summed to convert them into an analog signal which in turn is applied to a low-pass filter, rather than the provision of separate low-pass filters for the respective channels. Accordingly, the aliasing noises included in the PCM data for the respective channels can be removed by means of a common low-pass filter. This allows the entire construction of the system to be manufactured more simply and less costly.

In accordance with the present invention, further, the PCM data will not be limited to those read out from the waveform memory through each of the channels. For example, different PCM data can be read out from the waveform memory through the same channel. Thus, the signal synthesizing system according to the present invention is very high in universality for each channel. Even if PCM data in excess of the capacity corresponding to the number of channels are stored in the waveform memory, any PCM data combination can be optionally read out from the waveform memory through each of the channels to synthesize them into an analog signal.

BRIEF DESCRIPTION OF THE DRAWINGS

FIG. 2 illustrates an example of oversampling.

FIG. 8 illustrates the conversion of an analog signal into a PCM signal.

FIG. 11 illustrates cut-off frequencies for the PCM data.

DETAILED DESCRIPTION OF THE PREFERRED EMBODIMENT

Figures 1, 1A:
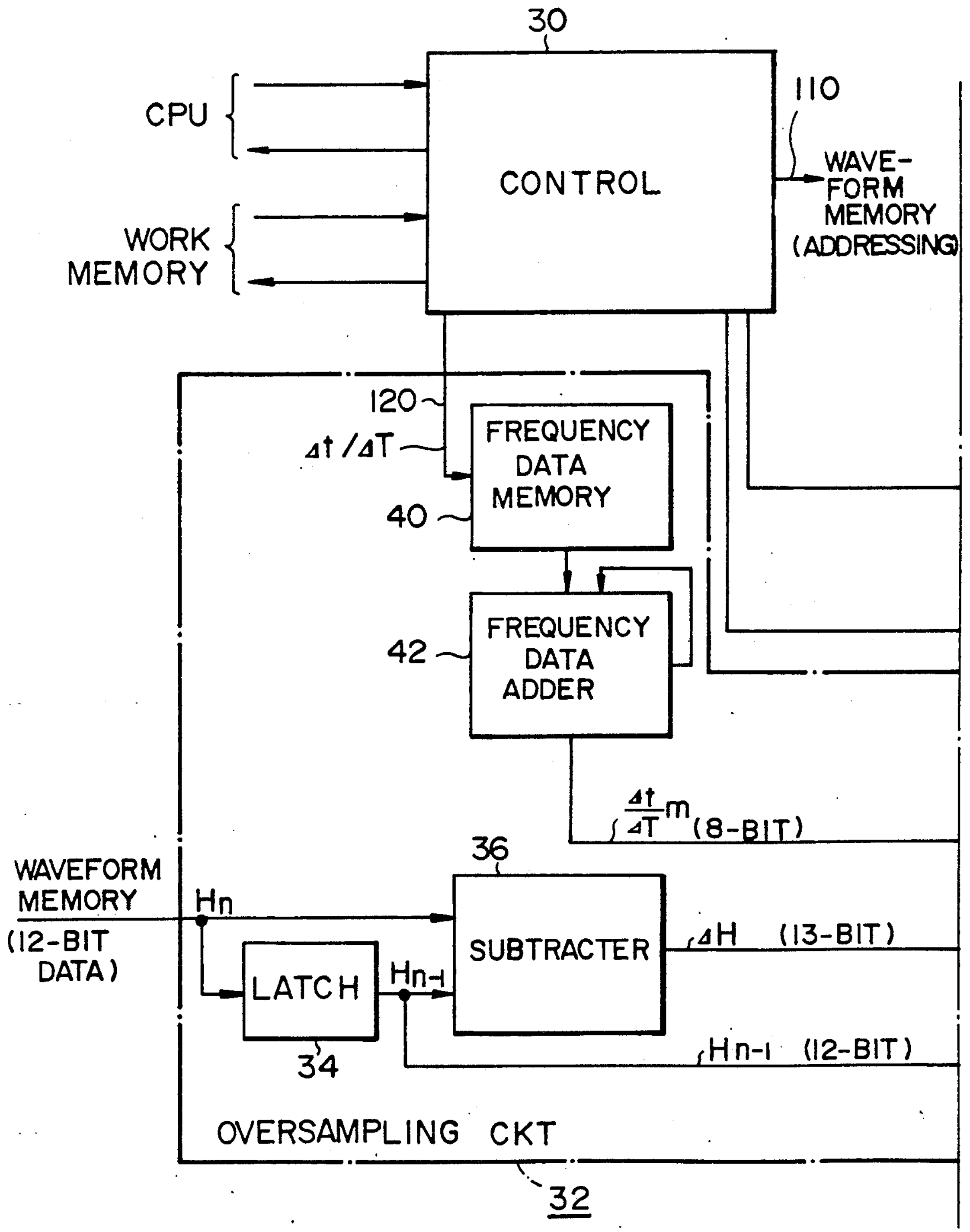
FIGS. 1, 1A, and 1B show a circuit diagram of a preferred embodiment of an analog signal synthesizing system in PCM constructed according to the present invention.
Figure 1B:
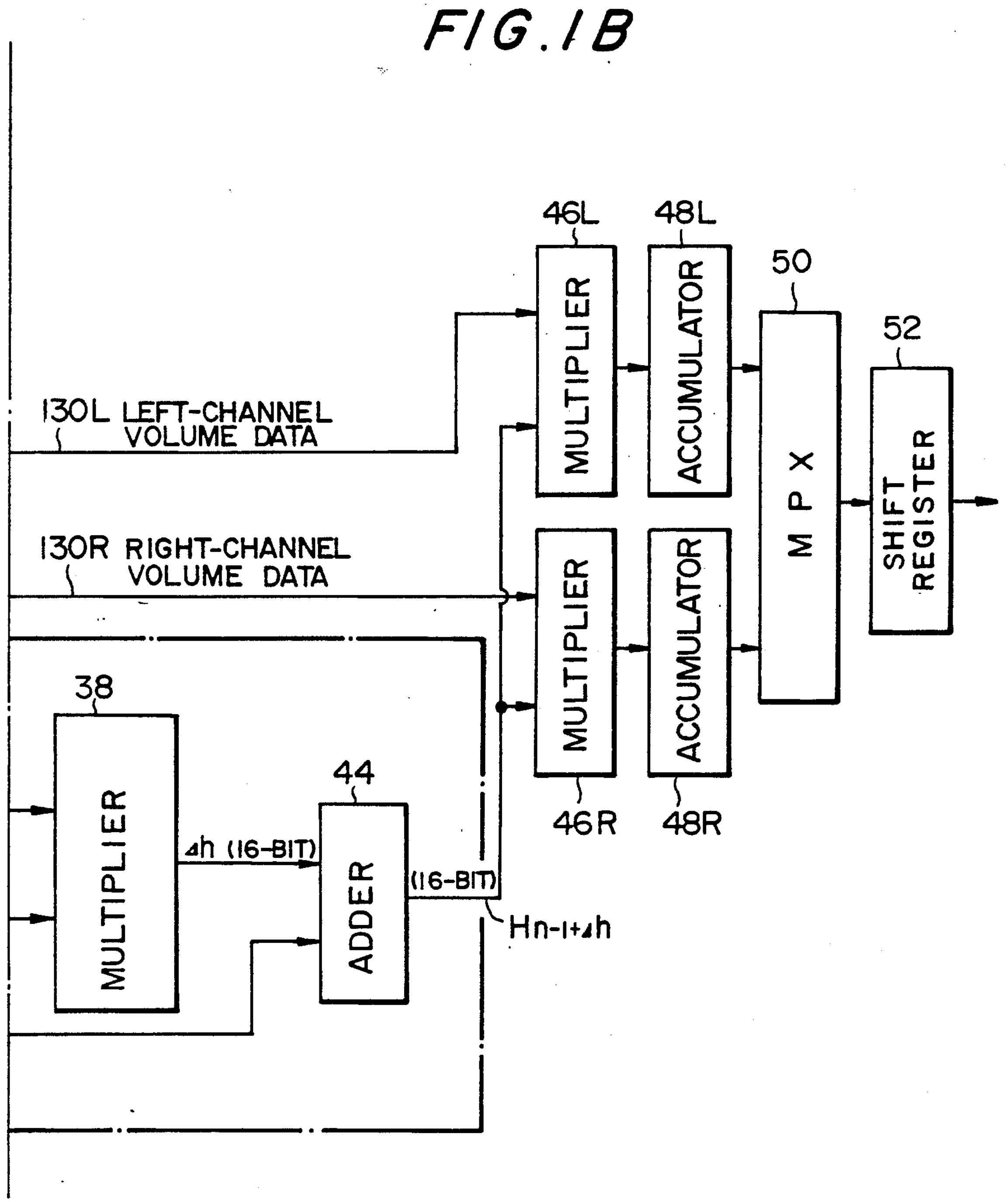

The present invention will now be described in connection with a preferred embodiment thereof illustrated in the drawings.

Figure 3:
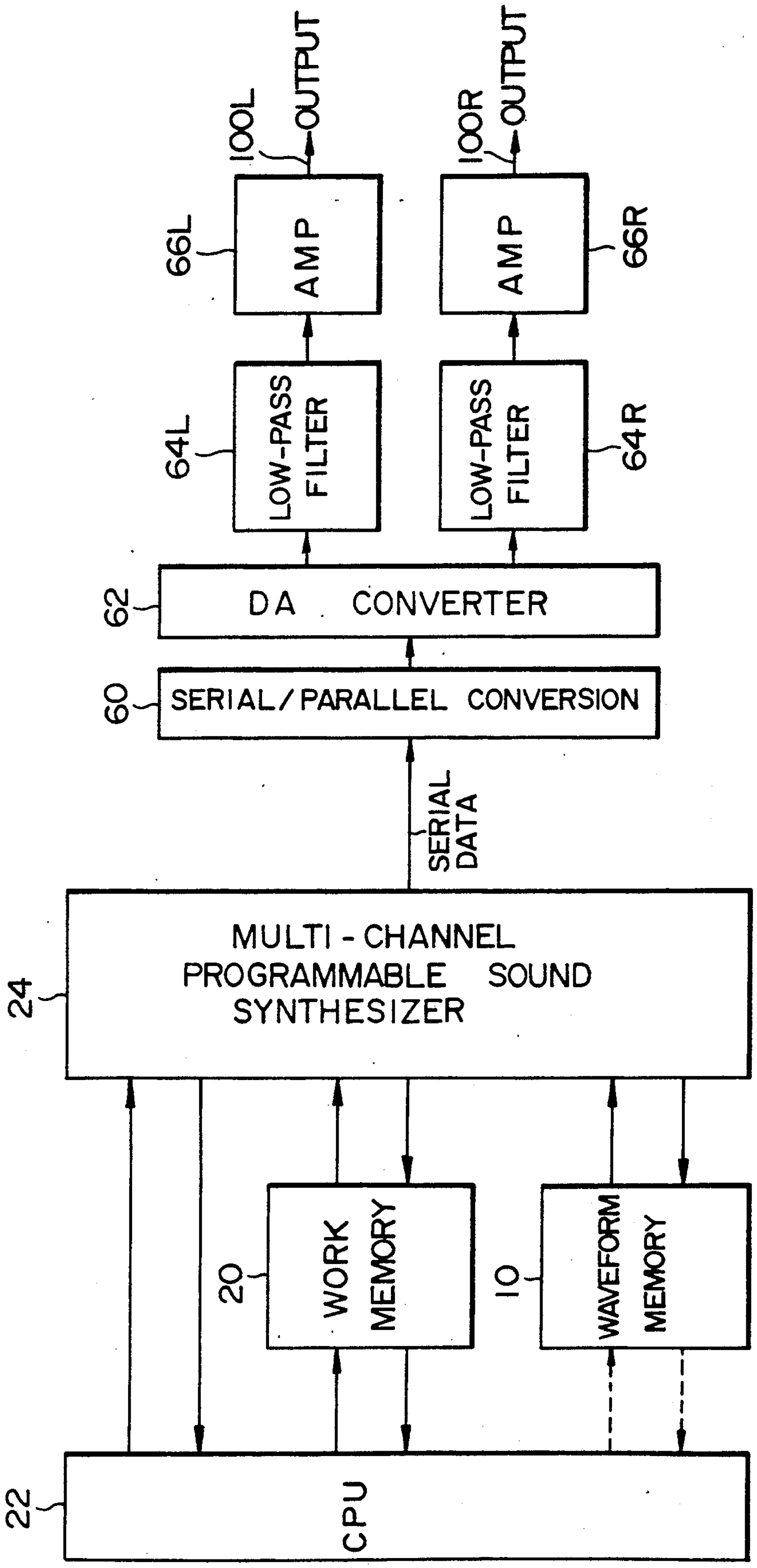
FIG. 3 is a block diagram of the entire construction of an analog signal synthesizing system to which the present invention is applied.

Referring now to FIG. 3, there is shown an analog signal synthesizing system which is an preferred embodiment of the present invention.

The analog signal synthesizing system comprises a waveform memory 10 which stores a plurality of voice signals (analog signals) as PCM data which are sampled with different sampling frequencies. PCM data corresponding to plural channels are read out from the waveform memory 10 and used to produce an output synthesized analog voice signal 100R for a right-hand speaker and an output synthesized analog voice signal 100L for a left-hand speaker.

To this end, the system also comprises a work memory 20, a CPU 22 and a multi-channel programmable sound synthesizer 24.

Figures 4A, 4B, 4C:
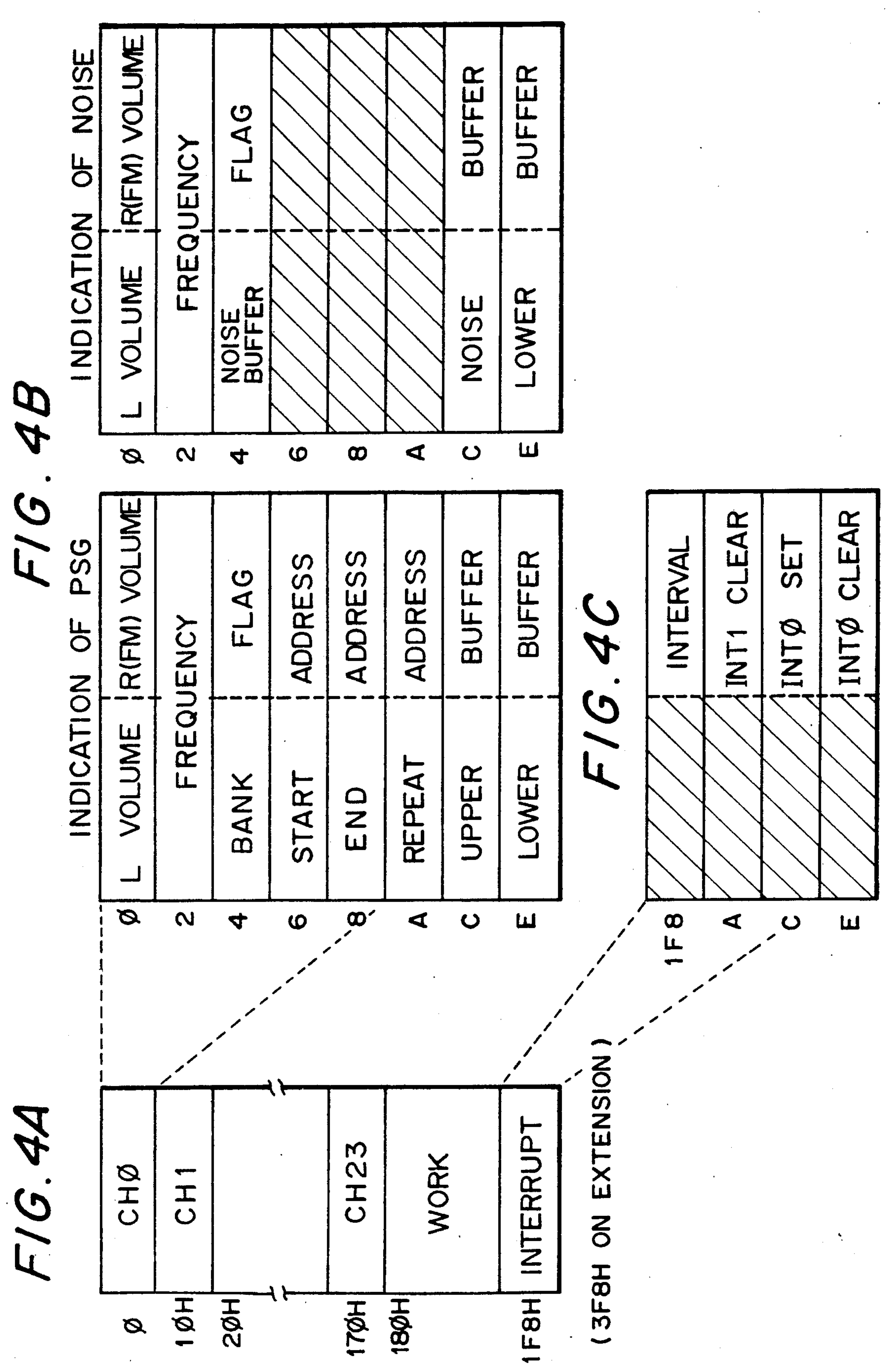
FIG. 4 illustrates the memory map in the work memory shown in FIG. 3.

The work memory 20 is provided with channel areas 0–23 addressed by addresses 0–17FH and interrupt areas addressed by addresses 1F8H–1FFH, as shown in FIG. 4A. The channel areas are so arranged as shown in FIG. 4B while the interrupt areas are so formed as shown in FIG. 4C.

Figure 5:
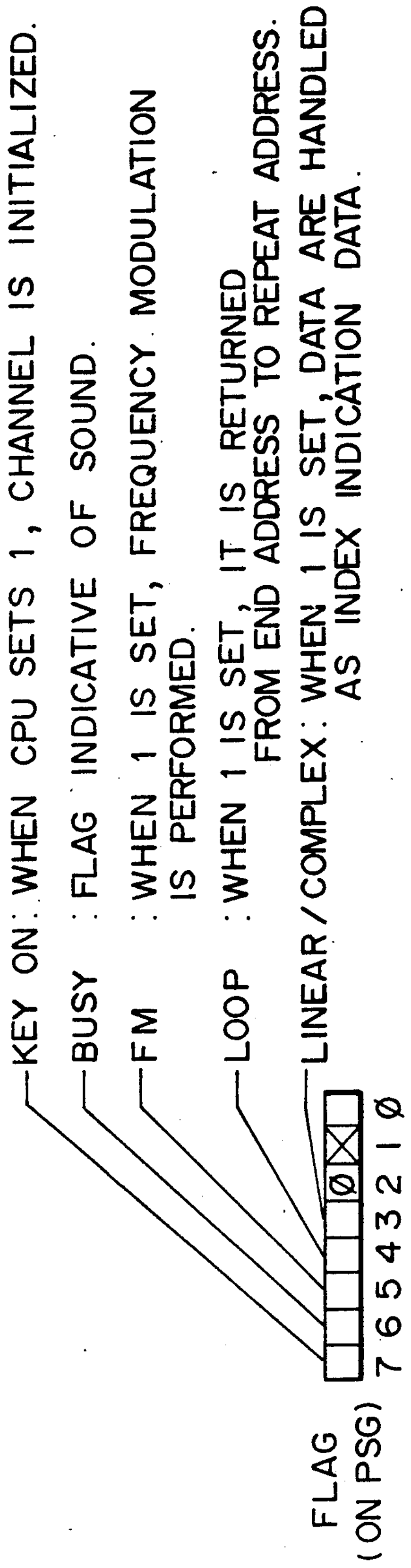
FIGS. 5 and 6 illustrate given areas in the memory map shown in FIG. 4B.
Figure 6:
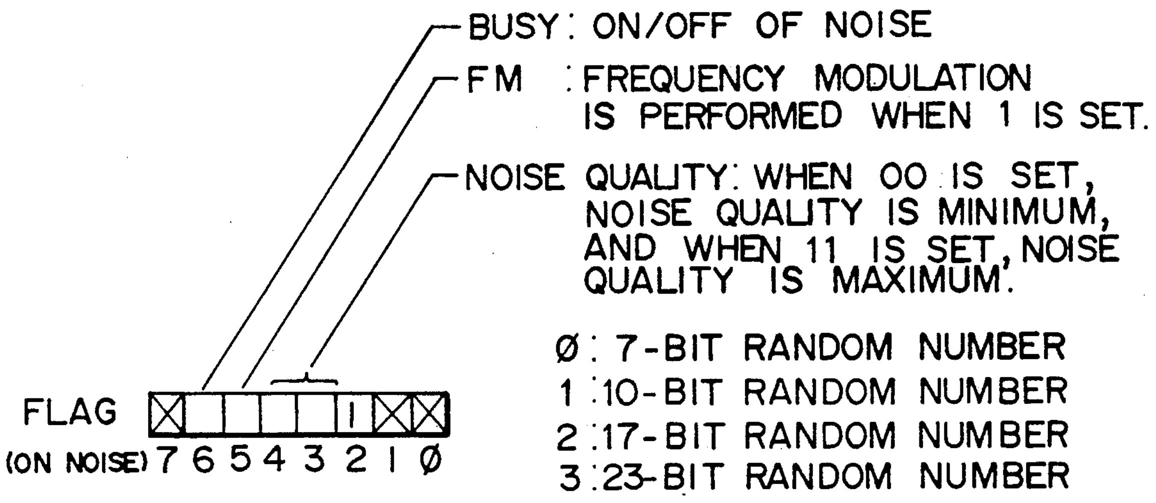

The magnitudes of left- and right-hand sounds in each of the channels are written in L-volume areas and R-volume areas for that channel as shown in FIG. 4B, respectively. Data representative of the musical interval of a voice outputted through that channel are written in the frequency area thereof. Such flags as shown in FIGS. 5 and 6 are written in the flag area. At the start and end addresses, read-start and read-end addresses for the waveform memory 10 are respectively written in the work memory 20. These read-start and read-end addresses are used to address PCM data to be read out from the waveform memory 10 through the corresponding channel. The repeat address includes a repeat-start address written therein for repeatedly reading the addressed PCM data.

CPU 22 is adapted to perform a computation of analog signal synthesization in accordance with an operational program with the result being applied to the multi-channel programmable sound synthesizer 24 through the work memory 20.

More particularly, the CPU 22 computes data to be written in each of the areas shown in FIG. 4A with the computed data being then written in the work memory 20. In addition, the CPU 22 outputs various data required to read the PCM data from the waveform memory 10 through each of the channels 0–23, which data are then applied to the multi-channel programmable sound synthesizer 24.

FIG. 1 shows the circuit arrangement of the multi-channel programmable sound synthesizer 24.

The synthesizer 24 comprises a control circuit 30 for reading the PCM data from the waveform memory 10 for each channel, based on both the data outputted from the CPU 22 and the data written in the work memory 20; and an oversampling circuit 32 for oversampling the PCM data read out from the waveform memory 10 for each channel.

The control circuit 30 is adapted to sequentially output reading-out addresses for the PCM data from the respective channels 0–23 toward the waveform memory 10 using the time sharing process. Thus, the PCM data for each channel are addressed by the corresponding reading-out address and sequentially read out from the waveform memory 10. The PCM data so read are then applied to the oversampling circuit 32.

If the musical interval is set higher, the control circuit 30 will increment the PCM data reading-out address at a shortened time interval. If the musical interval is set lower, the control circuit 30 will increment the reading-out address at a prolonged time interval.

At the same time, the control circuit 30 outputs frequency data 120 representing the musical interval of the read PCM data toward the oversampling circuit 32 while outputting volume data 130R and 130L indicating the right- and left-hand volumes toward multipliers 46R and 46L, respectively.

The oversampling circuit 32 is adapted to oversample the PCM data read out from the waveform memory 10 for each channel so that the sampling frequency of the read PCM data will be shifted toward the side of higher frequency.

The oversampling may be accomplished by using any suitable process such as primary interpolation (linear interpolation), secondary interpolation, digital filtering or the like. In the illustrated embodiment, the PCM data is processed by using the linear interpolation such that they will be shifted toward the side of higher frequency.

Figure 7:
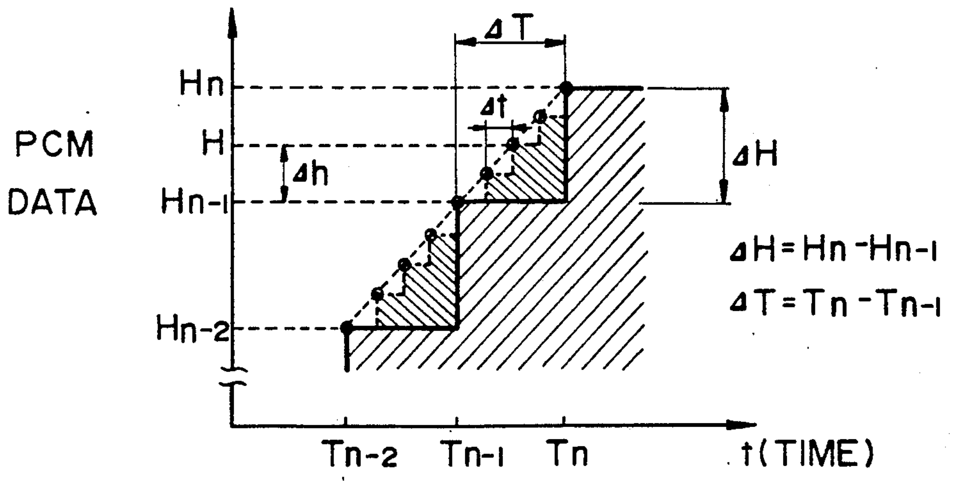
FIG. 7 illustrates a linear interpolation.
Figure 8A:
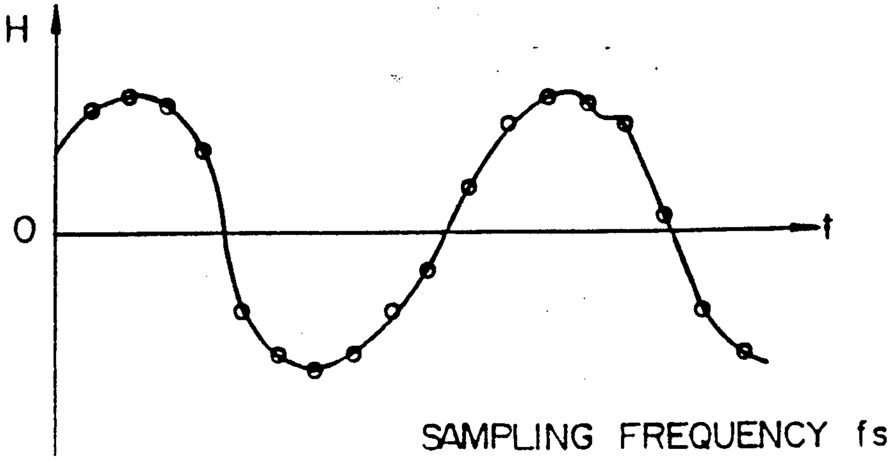
FIG. 8A (PRIOR ART)
FIG. 8A shows the sampling of the analog signal with a predetermined frequency.
Figure 8B:
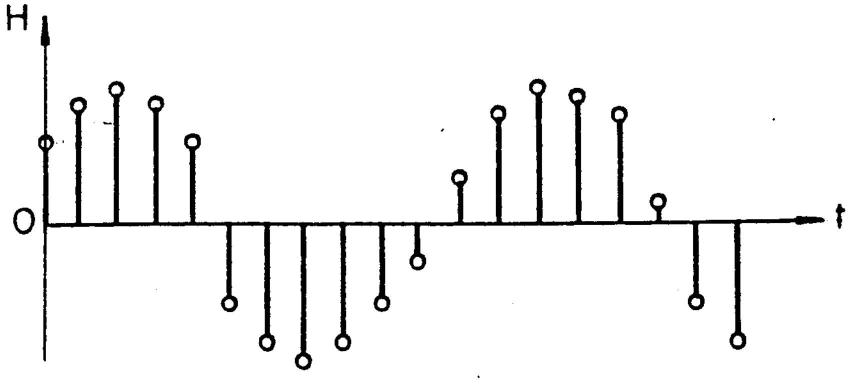
FIG. 8B (PRIOR ART)
FIG. 8B illustrates the sampled PAM wave.
Figure 9:
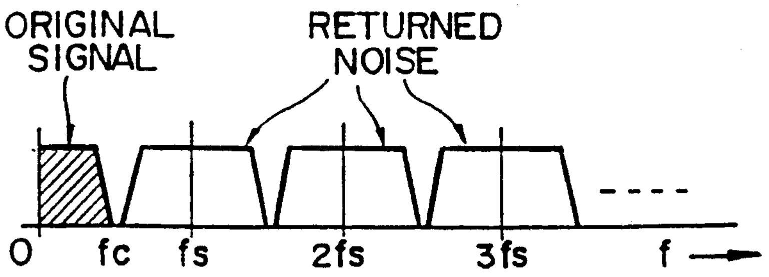
FIG. 9 (PRIOR ART)
FIG. 9 shows the spectra of frequency in the PCM data which are sampled with given sampling frequencies $f_s$.
Figure 10:
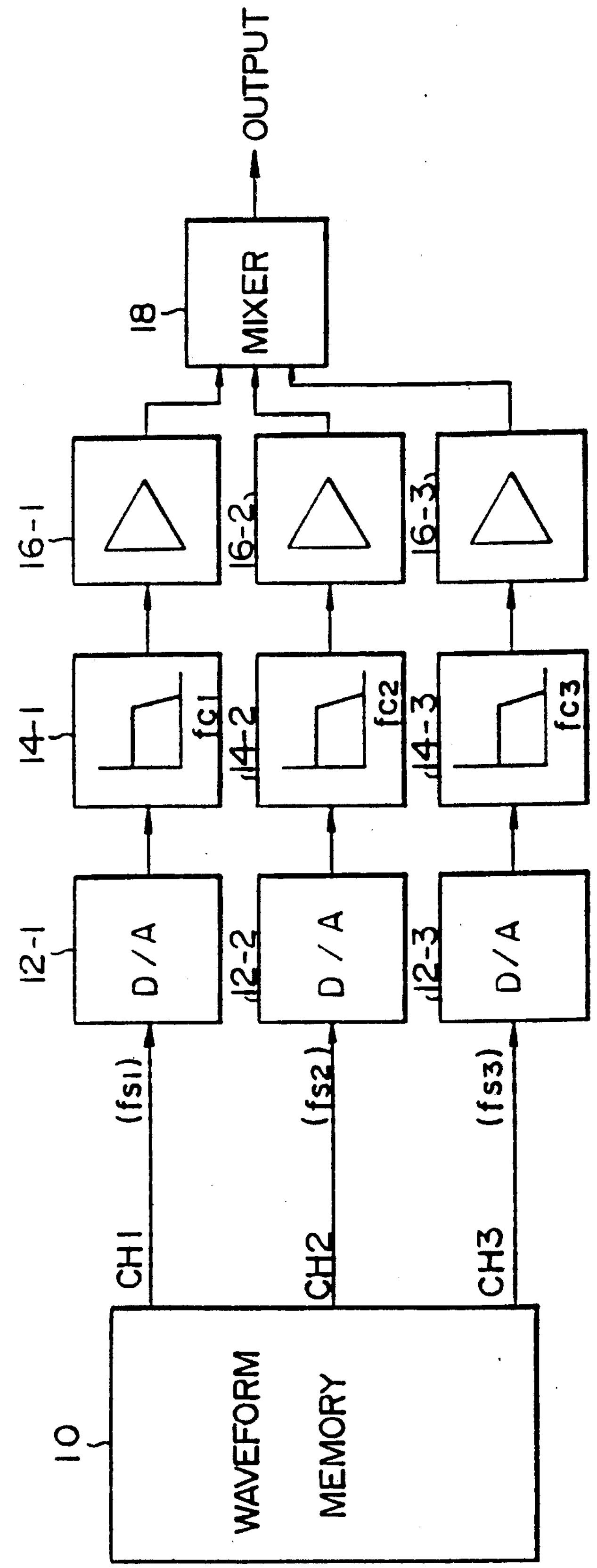
FIG. 10 (PRIOR ART)
FIG. 10 is a block diagram of a circuit usable in the conventional analog signal synthesizing system in PCM.
Figure 11A:
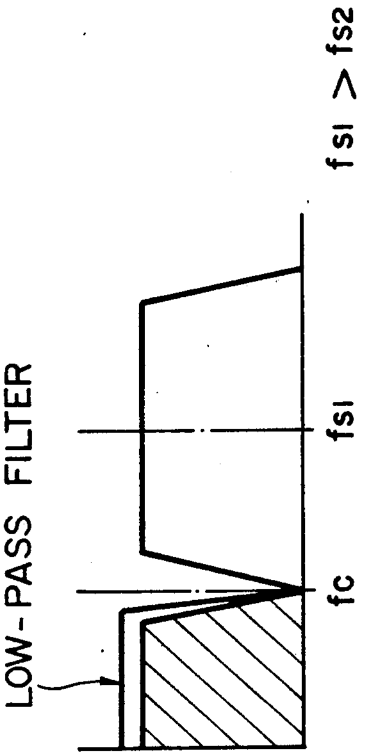
FIG. 11A shows the sampling frequency set one-half the cut-off frequency.
Figure 11B:
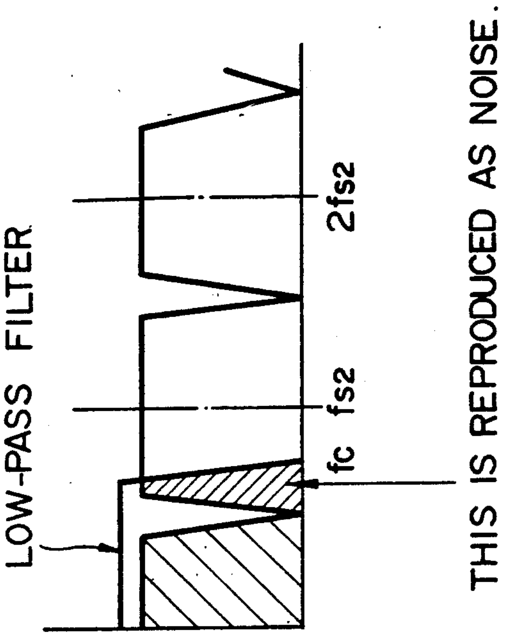
FIG. 11B shows the sampling frequency set one-half higher than the cut-off frequency.

It is now assumed that PCM data for a channel are read out from the waveform memory 10 in the order of $H_{n-1}$, $H_n$ and so on as shown in FIG. 7. In such a case, the m-th interpolation data H between the PCM data $H_{n-1}$ and $H_n$ can be determined as follows (m=0, 1, . . . ):

$$\begin{aligned} H &= H_{n-1} + \Delta h \\ &= H_{n-1} + (\Delta H/\Delta T)m\Delta t \\ &= H_{n-1} + (H_n - H_{n-1})m\Delta t/\Delta T \end{aligned} \quad (1)$$

where $\Delta T = T_n - T_{n-1}$; and each of $T_{n-1}$, $T_n$ . . . represents time at which the PCM data for each channel are outputted from the waveform memory 10.

When one of the interpolation data between the PCM data $H_{n-1}$ and $H_n$ is determined by such a linear interpolation equation, the sampling frequency $f_s$ of the PCM data read out from the waveform memory 10 can be shifted toward the side of higher frequency by two times the sampling frequency, that is, up to $2f_s$. If two of the interpolation data between the PCM data are determined, the sampling frequency can substantially be increased up to three times.

As seen from FIG. 1, the PCM data read out from the waveform memory 10 at this time are 12 bits, the data outputted from a subtractor 36 are 13 bits and the data outputted from a frequency data memory 40 are 8 bits. These data are computed at multiplier 38 and adder 44 for interpolation. The resulting PCM data will be extended to 16 bits with its resolution being increased.

For the linear interpolation, the oversampling circuit 32 comprises a latch circuit 34, the subtractor 36, the multiplier 38, the frequency data memory 40, a frequency data adder 42 and an adder 44.

The PCM data $H_n$ read out from the waveform memory 10 are applied to the latch circuit 34 and the subtractor 36.

The latch circuit 34 is adapted to output the previously inputted PCM data $H_{n-1}$ toward the subtractor 36 and adder 44. From the PCM data $H_n$ and $H_{n-1}$ thus inputted, the subtractor 36 computes $\Delta H = H_n - H_{n-1}$ which in turn is applied to the adder 38.

The frequency data memory 40 receives an initial value ($\Delta t/\Delta T$) from the control circuit 30 as frequency data representative of the musical interval of the PCM data. The frequency data adder 42 utilizes this initial value ($\Delta$ t/$\Delta$ T) to compute m($\Delta$ t/$\Delta$ T) which in turn is applied to the multiplier 38.

Based on the data so inputted, the multiplier 38 computes $\Delta$ h=($\Delta$ H/$\Delta$ T) m $\Delta$ t which in turn is applied to the adder 44.

The adder 44 totalizes the data thus inputted therein to compute the linear interpolation data H shown in the equation (1), which in turn are applied to the multipliers 46R and 46L.

Each of the multipliers 46R and 46L multiplies the PCM data from the oversampling circuit 32 by the right- or left-hand data 130R or 130L with the result being then applied to the corresponding one of right-channel and left-channel accumulators 48R and 48L.

The multi-channel programmable sound synthesizer 24 is adapted to repeat the aforementioned computation for all the channels 0–23 using the time sharing process. The computed data corresponding to all the channels 0–23 are sequentially accumulated at the accumulators 48R and 48L.

If the PCM data for the 23-th channel have been accumulated, the accumulated values in the right- and left-channel accumulators 48R and 48L are then applied sequentially to a shift register 52 through a multiplexer 50. The multiplexer 50 then converts the accumulated values for the left- and right-channels into serial data which in turn are outputted therefrom. These serial data are then applied to a D/A converter 62 through a serial-parallel converting circuit 60 shown in FIG. 3.

The conversion of the accumulated values into the serial data is performed since the synthesizer 24 of the illustrated embodiment is in the form of a serial data output type one-chip element which requires the reduced number of output pins. On the contrary, if the synthesizer 24 is in the form of a parallel data output type one-chip element having the increased number of output pins, the multiplexer 50, shift register 52 and serial-parallel converting circuit 60 may be omitted.

After the accumulated values for the right- and left-channels have been inputted in the D/A converter 62 through the serial-parallel converting circuit 60, they are converted into analog signals thereat which in turn are applied to the right-and left-channel low-pass filters 64R and 64L, respectively.

Each of the low-pass filters 64R and 64L has its own cut-off frequency $f_c$ set based on the corresponding sampling frequency which has been shifted to the side of higher frequency. As a result, any aliasing noise included the PCM data may be removed from the analog signals inputted therein. The analog signals are then outputted therefrom through amplifiers 66R and 66L as voice signals 100R and 100L for the right- and left-hand channels.

The operation of such an arrangement will be described below:

The signal synthesizing system of the illustrated embodiment is adapted to sequentially read PCM data from the waveform memory 10 for each of the channels 0–23 through the time sharing process.

Figure 2A:
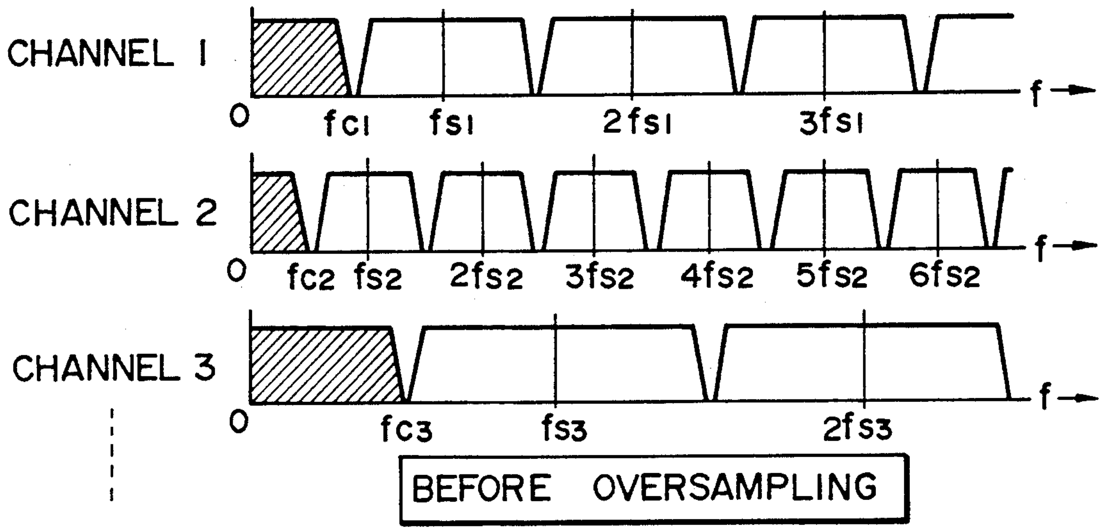
FIG. 2A shows the spectra of frequency in PCM data corresponding to each of the channels prior to the oversampling.

FIG. 2A shows the spectra of frequency in the PCM data read out from the waveform memory 10 for the respective channels. As described hereinbefore, the PCM data have its sampling frequency $f_s$ which has been shifted to two times the maximum frequency of the original analog signal. Therefore, the PCM data read out from the waveform memory 10 through each of the channels will include the spectrum of the original signal shown by hatching which is created in close proximity to the spectrum of the aliasing noise. If there is not set a cut-off frequency $f_c$ inherent in each of the channels, no aliasing noise can be removed reliably from the PCM data.

Figure 2B:
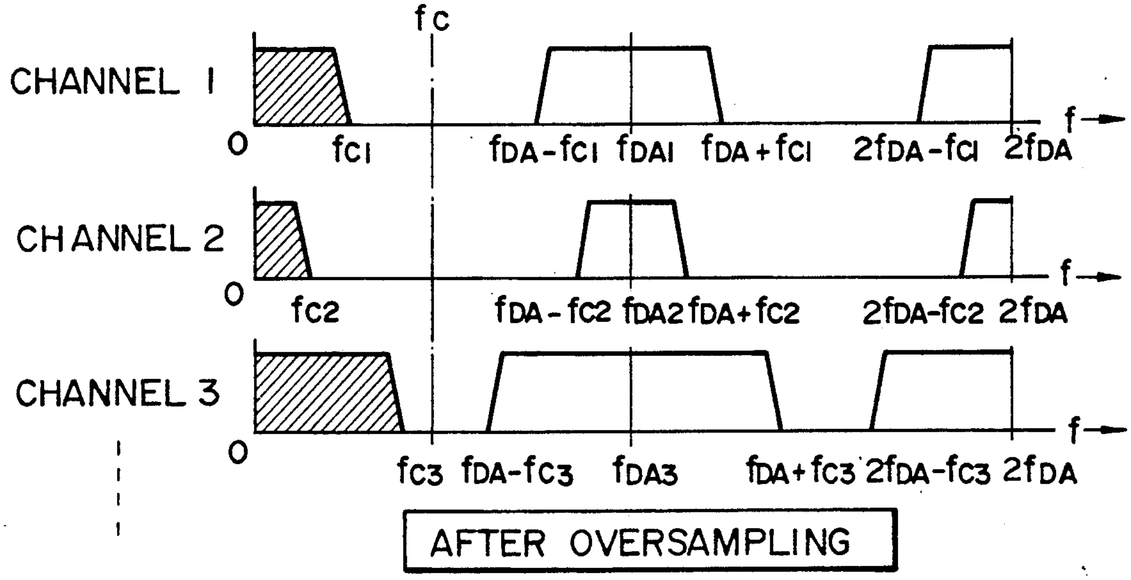
FIG. 2B shows the spectra of frequency after the oversampling.

On the contrary, the analog signal synthesizing system of the present invention comprises the oversampling circuit 32 for appropriately processing the PCM data read out from the waveform memory 10 for each channel so that the sampling frequency of the PCM data for each channel will be shifted to the side of higher frequency as shown in FIG. 2B.

In other words, the illustrated embodiment is adapted to determine the data H between the adjacent PCM data $H_{n-1}$ and $H_n$ by means of the linear interpolation, as shown in FIG. 7. Therefore, the rows of data having lower sampling frequencies shown in FIG. 2A can be converted into the other rows of data which are assumed that they are sampled with higher frequencies $f_{DA}$, such that the apparent sampling frequency $f_{DA}$ in the data row for each channel will be forcedly shifted to the side of higher frequency.

At this time, if one of the PCM interpolated data H is determined between the adjacent PCM data, the apparent sampling frequency can be increased up to two times. If interpolated data H of n in number (n is an integer) are determined between the respective adjacent PCM data, the apparent sampling frequency $f_{DA}$ can be increased up to (n+1) times the sampling frequency $f_s$.

By thus shifting the apparent sampling frequency $f_{DA}$ of the PCM data read out from the waveform memory 10 through each channel toward the side of higher frequency, the aliasing noises having lower frequencies for each channel can be forcedly shifted toward the side of higher frequency so that the spacing of frequency between the original signal and any aliasing noise will be expanded.

Even if the oversampled PCM data for each channel are synthesized by the use of the accumulators 48R and 48L, therefore, the original signal included in the synthesized PCM data will be overlapped by any aliasing noise with the spacing of frequency therebetween becoming sufficient.

In this connection, the sampling frequencies of the PCM data stored in the waveform memory 10 are previously known. When the PCM data are oversampled, thus, the maximum frequency of the original signal components included in all the PCM data as well as the minimum frequency of the aliasing noises can be previously determined.

If the cut-off frequencies $f_c$ in the low-pass filters 64R and 64L are established between the maximum frequency of the original signals and the minimum frequency of the aliasing noises, any aliasing noise included in the PCM data for each channel can be reliably removed only by providing the left- and right-channel low-pass filters 64L and 64R at the output stage of the D/A converter 62.

Thus, the illustrated embodiment of the present invention requires only a single low-pass filter 64R for all the right-hand channels and only a single low-pass filter 64L for all the left-hand channels so as to reliably remove the aliasing noises included in the PCM data outputted through all the channels 0–23.

In accordance with the present invention, PCM data having any sampling frequency may be read out from the waveform memory through each of the channels 0–23. Even if the waveform memory 10 stores 25 or more different types of PCM data, thus, any combination of the PCM data can be read out from the waveform memory 10 through the total number of 24 channels 0–23 and synthesized into an analog signal. In comparison with the conventional signal synthesizing systems wherein the types of PCM data are established at one-to-one relative to the number of channels, the entire system of the present invention may be very well improved in universality and simplicity.

It is to be understood that the present invention is not limited to the illustrated embodiment. Many modifications and changes thereof may be carried out without departing from the spirit and scope of the invention as defined in claims.

While the illustrated embodiment has been described as to the linear interpolation for oversampling, the present invention may be applied to any other interpolating process such as secondary interpolation, cubical interpolation or Lagrange's interpolation.

The oversampling process may be similarly accomplished by any other interpolating process such as digital filtering process.

While the PCM data $H_{n-1}$, $H_n$ and so on themselves are not interpolated in the illustrated embodiment, they may be interpolated if required.

While the illustrated embodiment has been described as to the synthesization of voice signals, the present invention may be similarly applied to the synthesization of any other analog signals, if desired.

As will be apparent from the foregoing, the signal synthesizing system of the present invention can be simplified and reduced in manufacturing cost since a common low-pass filter is used to remove the aliasing noise included in the PCM data for each channel, comparing to the conventional signal synthesizing systems wherein a low-pass filter having its inherent cut-off frequency must be provided for each channel.

In accordance with the present invention, further, PCM data sampled with any type of sampling frequency may be read out from the waveform memory through each of the channels. Thus, more types of analog signals can be synthesized by the use of less channels, comparing to the conventional signal synthesizing systems wherein the types of PCM data to be read out are limited for each of the channels.

Even if the signal synthesizing system of the present invention includes the same number of channels as those of the prior art, therefore, PCM data exceeding the number of channels may be stored in the waveform memory. These PCM data can be read out from the waveform memory in any combination to synthesize and output more types of analog signals. Furthermore, where the types of PCM data written in the waveform memory coincide with those of the conventional systems, the number of channels may be decreased, if required. This also results in simplification of the entire construction of the system and reduction of the manufacturing cost.

We claim:

1. An apparatus for synthesizing analog signals in PCM, said apparatus comprising waveform memory adapted to store a plurality of analog signals as PCM data sampled with different sampling frequencies, the portion of said PCM data corresponding to plural channels being read from said waveform memory and used to synthesize the analog signals, said apparatus being characterized in that it comprises:

oversampling means for shifting the sampling frequency of said PCM data read from a waveform memory for each channel to the side of high frequency;

means for summing said oversampled PCM data for the respective channel;

D/A converting means for converting the summed data into an analog signal; and a low-pass filter for setting a cut-off frequency based on the sampling frequencies shifted to the side of high frequency and for eliminating any aliasing noise included in the PCM data from the synthesized analog signal;

whereby the elimination of the aliasing noise included in the PCM data for each channel can be carried out at the common low-pass filter.

2. An apparatus as defined in claim 1, further comprising:

a work memory including a plurality of channel areas in each of which the data for each channel are stored;

a CPU for performing a computation synthesizing the analog signals in accordance with a predetermined operational program and writing the output data of each channel into the corresponding channel area in said work memory, said CPU being further adapted to compute and output data required to read the PCM data from said waveform memory for each channel; and a control circuit for reading the PCM data from said waveform memory for each channel and inputting them into said oversampling means, based on the data computed by and outputted from said CPU and the data written in said work memory.

3. An apparatus as defined in claim 2 wherein said waveform memory is adapted to store PCM data which exceed the number of channels used and wherein said control circuit is adapted to read said PCM data for each channel in any combination and to input them into said oversampling means.

4. An apparatus as defined in claim 2 wherein said oversampling means comprises right- and left-channel multipliers all of which are provided in the backward stage of said oversampling means and right- and left-channel adding means which are provided in the backward stages of said right- and left-channel multipliers, said control circuit being adapted to output volume data indicating left and right volumes in the read PCM data toward said right- and left-channel multipliers, said right-and left-channel multipliers being adapted to multiply the interpolated data H outputted from said oversampling means by said right- and left-channel volume data, and said right- and left-channel adding means being adapted to sequentially accumulate the computed data sequentially outputted from the corresponding multiplier for the respective channels and to output the accumulated data toward the D/A converting means in the backward stage thereof as the accumulation is completed for the last channel.

5. An apparatus as defined in claim 4 wherein said low-pass filter means includes right- and left-channel low-pass filters, said right-channel low-pass filter being adapted to eliminate aliasing noises included in the PCM data from the output of said right-channel adding means through said D/A converting means and said left-channel low-pass filter being adapted to eliminate aliasing noises included in the PCM data from the output of said left-channel adding means through said D/A converting means.

6. An apparatus as defined in claim 2 wherein said control circuit is adapted to sequentially output PCM data reading address for each channel toward said waveform memory in a time sharing manner and to sequentially read PCM data addressed by each of the reading addresses for each channel.

7. An apparatus as defined in claim 6 wherein said control circuit is adapted to increment the PCM reading address for any channel at a shortened time interval when it is desired to set a higher interval of said channel and to increment the PCM reading address at a prolonged time interval when it is desired to set a lower interval in said channel, whereby the musical interval of the PCM data read for said channel can be controlled.

8. An apparatus as defined in claim 7 wherein said waveform memory is adapted to store the PCM data which exceed the number of the channels used and wherein said control circuit is adapted to read said PCM data from the channels in any combination and then to input them into said oversampling means.

9. An apparatus as defined in claim 6 wherein said oversampling means is adapted to compute the PCM data read from said waveform memory in the order of $H_{n-1}$, $H_n$ . . . so as to obtain the m-th interpolated data H (where m is an integer representative of 0, 1 . . . ) between $H_{n-1}$ and $H_n$ by the following equation:

$$\begin{aligned} H &= H_{n-1} + \Delta h \qquad (1) \\ &= H_{n-1} + (\Delta H/\Delta T)m\Delta t \\ &= H_{n-1} + (H_n - H_{n-1})m\Delta t/\Delta T \\ &\text{but } \Delta T = T_n - T_{n-1}, \end{aligned}$$

where $T_{n-1}$, $T_n$ . . . represent times at which each of the PCM data is read and $\Delta$ t is a time interval for each of the interpolated data, whereby the PCM data for each of said channels can be N-order interpolated.

10. An apparatus as defined in claim 9 wherein said control circuit is adapted to output the initial value $\Delta$ t/$\Delta$ T of the frequency data representative of the musical interval of PCM data newly read from said waveform memory and wherein said oversampling means comprises a latch circuit for holding and outputting the PCM data $H_{n-1}$ inputted thereinto from said waveform memory; a subtractor for computing and outputting $\Delta H = H_n - H_{n-1}$ from the PCM data $H_n$ newly inputted from said waveform memory and the previous PCM data $H_{n-1}$ outputted from said latch means; a frequency data memory for receiving an initial value ($\Delta$ t/$\Delta$ T) of the frequency data representative of the musical interval of the PCM data; a frequency data adder for computing m($\Delta$ t/$\Delta$ T) using said initial value in said frequency data memory; a multiplier for computing $\Delta h = (\Delta H/\Delta T) m \Delta T$, based on input data from said adder and frequency data memory; and an another adder for computing and outputting the interpolated data H obtained from said equation (1), based on input data from said multiplier and latch circuit.

11. An apparatus as defined in claim 10 wherein said oversampling means is adapted to repeatedly perform the N-order interpolation of PCM data for each channel in a time sharing manner.

12. An apparatus as defined in claim 11, further comprising right- and left-channel multipliers all of which are provided in the backward stage of said oversampling means and right- and left-channel adding means which are provided in the backward stages of said right- and left-channel multipliers, said control circuit being adapted to output volume data indicating left and right volumes in the read PCM data toward said right- and left-channel multipliers, said right- and left-channel multipliers being adapted to multiply the interpolated data H outputted from said oversampling means by said right- and left-channel volume data, and said right- and left-channel adding means being adapted to sequentially accumulate the computed data sequentially outputted from the corresponding multiplier for the respective channels and to output the accumulated data toward the D/A converting means in the backward stage thereof as the accumulation is completed for the last channel.

13. An apparatus as defined in claim 12 wherein said low-pass filter means includes right- and left-channel low-pass filters, said right-channel low-pass filter being adapted to eliminate aliasing noises included in the PCM data from the output of said right-channel adding means through said D/A converting means and said left-channel low-pass filter being adapted to eliminate aliasing noises included in the PCM data from the output of said left-channel adding means through said D/A converting means.

14. An apparatus as defined in claim 1 wherein said oversampling means is adapted to N-order interpolate the PCM data read from said waveform memory for each channel (where N is an integer) and to shift the sampling frequency of the PCM data for each channel into the side of high frequency.

15. An apparatus as defined in claim 14 wherein said oversampling means is adapted to compute the PCM data read from said waveform memory in the order of $H_{n-1}$, $H_n$ . . . so as to obtain the m-th interpolated data H (where m is an integer representative of 0, 1 . . . ) between $H_{n-1}$ and $H_n$ by the following equation:

$$\begin{aligned} H &= H_{n-1} + \Delta h \qquad (1) \\ &= H_{n-1} + (\Delta H/\Delta T)m\Delta t \\ &= H_{n-1} + (H_n - H_{n-1})m\Delta t/\Delta T \\ &\text{but } \Delta T = T_n - T_{n-1}, \end{aligned}$$

where $T_{n-1}$, $T_n$ . . . represent times at which each of the PCM data is read and $\Delta$ t is a time interval for each of the interpolated data, whereby the PCM data for each of said channels can be N-order interpolated.

16. An apparatus as define in claim 15 wherein said oversampling means comprises:

a latch circuit for holding and outputting the PCM data $H_{n-1}$ inputted thereinto from said waveform memory;

a subtractor for computing and outputting $\Delta H = H_n - H_{n-1}$ from the PCM data $H_n$ newly inputted from said waveform memory and the previous PCM data $H_{n-1}$ outputted from said latch means;

a frequency data memory for receiving an initial value ($\Delta$ t/$\Delta$ T) of the frequency data representative of the musical interval of the PCM data;

a frequency data adder for computing m($\Delta$ t/$\Delta$ T) using said initial value in said frequency data memory;

a multiplier for computing $\Delta h = (\Delta H/\Delta T) m \Delta T$, based on input data from said adder and frequency data memory; and an another adder for computing and outputting the interpolated data H obtained from said equation (1), based on input data from said multiplier and latch circuit.

17. An apparatus as defined in claim 16 wherein said oversampling means is adapted to repeatedly perform the N-order interpolation of PCM data for each channel in a time sharing manner.

18. An apparatus as defined in claim 17 wherein said summing means is adapted to sequentially accumulate the computed data outputted from said oversampling means for the respective channels and to ouput the accumulated value toward said D/A converting means as the computed data for the last channel has been added into the previous accumulated data.

19. An apparatus as defined in claim 1 wherein said oversampling means is adapted to interpolate the PCM data read from said waveform memeory for each channel using the Lagrange's interpolation formula and to shift the sampling frequency of said PCM data for each channel into the side of high frequency.

20. An apparatus as defined in claim 1 wherein said oversampling means is adapted to interpolate the PCM data read from said waveform memory for each channel in a digital filtering manner and to shift the sampling frequency of said PCM data for each channel into the side of high frequency.

21. An apparatus as defined in claim 1 wherein said oversampling means is adapted to shift the PCM data read for each channel toward the side of high frequency while extending the number of bits in said PCM data.

* * * * *